United States Patent
Seol et al.

(10) Patent No.: US 8,301,978 B2
(45) Date of Patent: Oct. 30, 2012

(54) MEMORY DEVICE AND METHOD OF STORING DATA WITH ERROR CORRECTION USING CODEWORDS

(75) Inventors: Kwang Soo Seol, Yongin-si (KR); Sung Il Park, Suwon-si (KR); Kyoung Lae Cho, Yongin-si (KR); In Sung Joe, Seoul (KR)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 773 days.

(21) Appl. No.: 12/453,814

(22) Filed: May 22, 2009

(65) Prior Publication Data

US 2009/0292973 A1    Nov. 26, 2009

(30) Foreign Application Priority Data

May 23, 2008   (KR) .................. 10-2008-0048267

(51) Int. Cl.
   *G11C 29/00* (2006.01)
(52) U.S. Cl. .............. 714/763; 365/185.09; 365/185.24; 365/185.33
(58) Field of Classification Search .................. 714/763; 365/185.09, 185.24, 185.33
   See application file for complete search history.

(56) References Cited

U.S. PATENT DOCUMENTS

| | | | |
|---|---|---|---|
| 5,638,188 A * | 6/1997 | Moro et al. | 358/3.03 |
| 6,279,133 B1 * | 8/2001 | Vafai et al. | 714/763 |
| 6,888,479 B2 * | 5/2005 | Sakagami et al. | 341/56 |
| 6,903,887 B2 * | 6/2005 | Asano et al. | 360/31 |
| 6,990,614 B1 * | 1/2006 | Nagasawa et al. | 714/701 |
| 7,099,256 B2 * | 8/2006 | Wada et al. | 369/59.21 |
| 7,126,850 B2 | 10/2006 | Tatsukawa et al. | |
| 7,900,100 B2 * | 3/2011 | Gollub | 714/718 |
| 7,949,931 B2 * | 5/2011 | Lastras-Montano | 714/785 |
| 2006/0075320 A1 | 4/2006 | Gendrier et al. | |
| 2006/0150063 A1 | 7/2006 | Hillman | |
| 2008/0031042 A1 | 2/2008 | Sharon | |

FOREIGN PATENT DOCUMENTS

| | | |
|---|---|---|
| JP | 10-055687 | 2/1998 |
| KR | 2000-0068504 | 11/2000 |
| KR | 10-2007-0054659 | 5/2007 |
| KR | 10-2007-0087557 | 8/2007 |
| WO | WO 2007/010189 | 1/2007 |

* cited by examiner

*Primary Examiner* — Esaw Abraham
(74) *Attorney, Agent, or Firm* — Harness, Dickey & Pierce, P.L.C.

(57) ABSTRACT

Memory devices and/or methods of storing memory data bits are provided. A memory device includes a multi-level cell (MLC) array including a plurality of MLCs, an error correction unit configured to encode data to be recorded in an MLC, where the encoded data is converted to convert the encoded data into a codeword, an error pattern analysis unit configured to analyze a first data pattern included in the codeword corresponding to an error pattern included in the codeword and a data conversion unit configured to convert the analyzed first data pattern into a second data pattern. According to the above memory devices and/or methods, it is possible to efficiently reduce a data error that occurs when the data is stored for a relatively long period of time, thereby improving reliability.

29 Claims, 5 Drawing Sheets

MEMORY DEVICE AND METHOD OF STORING DATA WITH ERROR CORRECTION USING CODEWORDS

PRIORITY STATEMENT

This application claims priority under 35 U.S.C. §119 to Korean Patent Application No. 10-2008-0048267, filed on May 23, 2008, in the Korean Intellectual Property Office (KIPO), the entire contents of which are incorporated herein by reference.

BACKGROUND

1. Field

Example embodiments relate to methods that may store data bits of memory devices. Also, example embodiments relate to multi-level cell (MLC) memory devices or multi-bit cell (MBC) memory devices and/or data bit storage methods that may record/read data bits of the memory devices.

2. Description of Related Art

A multi-level cell (MLC) memory device that may store data of two or more bits in a single memory cell has been proposed in response to a need for higher integration of memory. The MLC memory device may also be referred to as a multi-bit cell (MBC) memory. However, as the number of bits programmed in the single memory cell increases, reliability may deteriorate and a read-failure rate may increase. To program 'm' bits in the single memory cell, any one of $2^m$ threshold voltages may need to be generated in the memory cell. Threshold voltages of memory cells where the same data is programmed may generate a distribution within a predetermined range due to minute electrical characteristic differences between the memory cells. Each threshold voltage distribution may correspond to each of $2^m$ data values generated by 'm' bits.

However, since a voltage window for a memory device is limited, a distance between $2^m$ distributions of threshold voltages between adjacent bits may decrease as 'm' increases, and the distributions may overlap as the distance between the distributions decreases. When the distributions are overlapped, the read-failure rate may increase.

When data is stored over a long period of time, a lateral movement of a charge caused by an electrostatic attractive force between the charge stored in the memory cell and the charge stored in an adjacent cell may occur within a charge trap memory including a multi-level cell, thus leading to a higher probability that a read error occurs.

SUMMARY

Example embodiments may provide apparatuses and/or methods that may reduce a data error that occurs when data is stored for a relatively long period of time, thereby improving reliability of memory devices.

Example embodiments also may provide apparatuses and/or methods that may manage an error pattern having a high probability that a data error occurs, thereby increasing a data retention time.

Example embodiments also may provide apparatuses and/or methods that may manage an error pattern having a high probability that an error occurs when reading data, and may manage error control codes (ECC) in parallel, thereby reducing a read error that occurs due to a lateral charge movement between adjacent cells.

According to example embodiments, a memory device may include a multi-level cell (MLC) array including a plurality of MLCs, an error correction unit configured to encode data to be recorded in an MLC, where the encoded data is converted to convert the encoded data into a codeword, an error pattern analysis unit configured to analyze a first data pattern included in the codeword corresponding to an error pattern included in the codeword and a data conversion unit configured to convert the analyzed first data pattern into a second data pattern.

According to example embodiments, a method of storing data may include encoding data to convert the encoded data into a codeword, analyzing a first data pattern corresponding to an error pattern included in the codeword, and converting the analyzed first data pattern into a second data pattern. Example embodiments may also include recording the codeword including the converted second data pattern in the MLC.

BRIEF DESCRIPTION OF THE DRAWINGS

The above and other features and advantages of example embodiments will become more apparent by describing in detail example embodiments with reference to the attached drawings in which.

DETAILED DESCRIPTION OF EXAMPLE EMBODIMENTS

Figure 1:
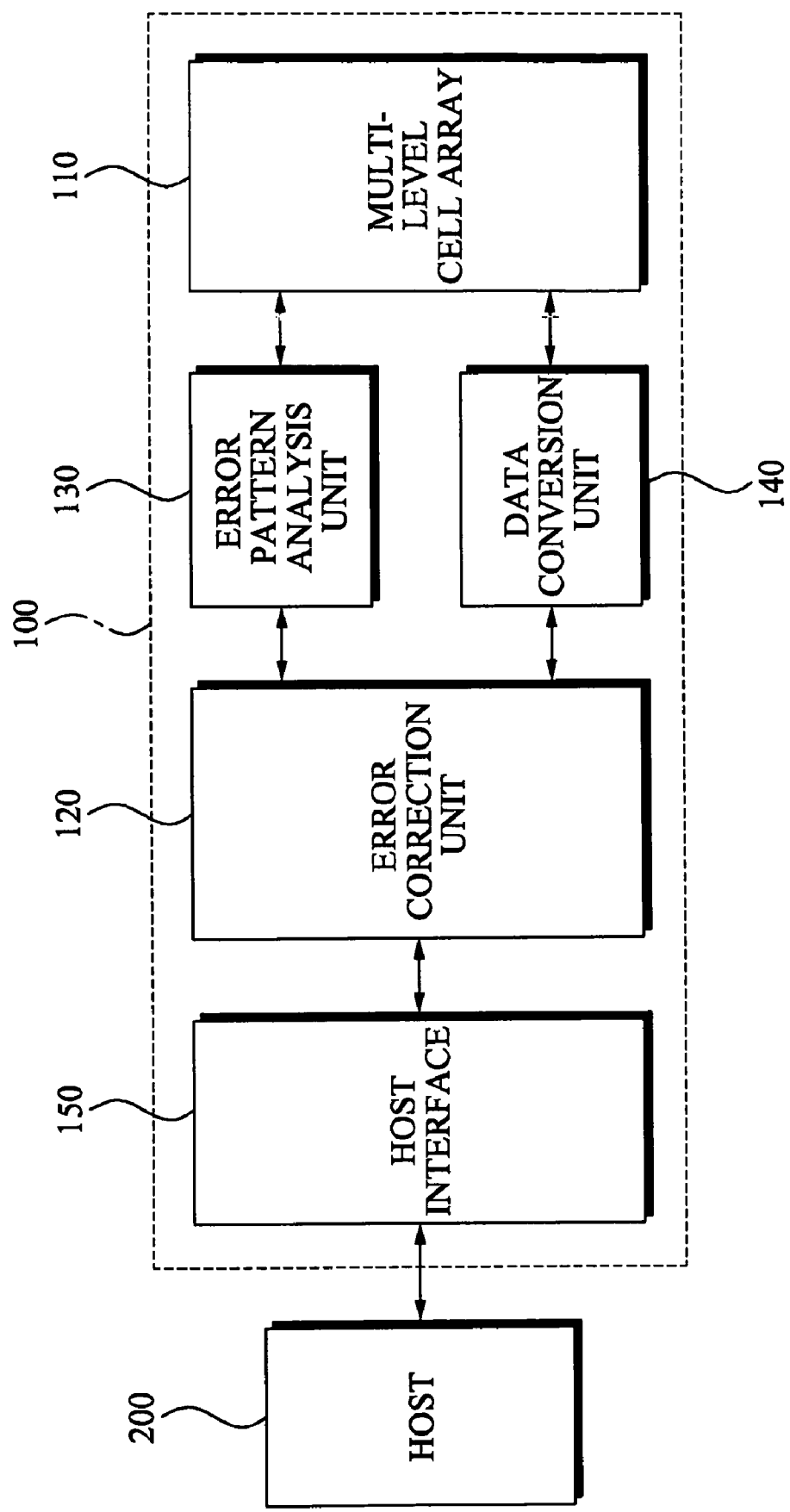
FIG. 1 is a block diagram illustrating a memory device according to example embodiments.

Detailed example embodiments are disclosed herein. However, specific structural and functional details disclosed herein are merely representative for purposes of describing example embodiments. Example embodiments may, however, may be embodied in many alternate forms and should not be construed as being limited to only the embodiments set forth herein.

Accordingly, while example embodiments are capable of various modifications and alternate forms, embodiments thereof are shown by way of example in the drawings and will herein be described in detail. It should be understood, however, that there is not intent to limit example embodiments to the particular forms disclosed, but to the contrary, example embodiments are to cover all modifications, equivalents, and alternatives falling within the scope of the example embodiments. Like numbers refer to like elements throughout the description of the figures.

It will be understood that when an element is referred to as being "connected" or "coupled" to another element, it may be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between", "adjacent" versus "directly adjacent", etc.).

It will be understood that although the terms first, second, third, etc., may be used herein to describe various elements, components, regions, layers, and/or sections, these elements, components, regions, layers, and/or sections should not be limited by these terms. These terms are only used to distinguish one element, component, region, layer, and/or section from another element, component, region, layer, and/or section. For example, a first element, component, region, layer, and/or section could be termed a second element, component, region, layer, and/or section without departing from the teachings of example embodiments.

Spatially relative terms, such as "beneath," "below," "lower," "above," "upper," and the like may be used herein for ease of description to describe the relationship of one component and/or feature to another component and/or feature, or other component(s) and/or feature(s), as illustrated in the drawings. It will be understood that the spatially relative terms are intended to encompass different orientations of the device in use or operation in addition to the orientation depicted in the figures. The figures are intended to depict example embodiments and should not be interpreted to limit the intended scope of the claims. The accompanying figures are not to be considered as drawn to scale unless explicitly noted.

The terminology used herein is for the purpose of describing particular example embodiments only and is not intended to be limiting. As used herein, the singular forms "a," "an," and "the" are intended to include the plural forms as well, unless the context clearly indicates otherwise. It will be further understood that the terms "comprises," "comprising," "includes," and/or "including," when used in this specification, specify the presence of stated features, integers, steps, operations, elements, and/or components, but do not preclude the presence or addition of one or more other features, integers, steps, operations, elements, and/or components.

Unless otherwise defined, all terms (including technical and scientific terms) used herein have the same meaning as commonly understood by one of ordinary skill in the art to which example embodiments belongs. It will be further understood that terms, such as those defined in commonly used dictionaries, should be interpreted as having a meaning that is consistent with their meaning in the context of the relevant art and should not be interpreted in an idealized or overly formal sense unless expressly so defined herein.

Example embodiments having thus been described, it will be obvious that the same may be varied in many ways. Such variations are not to be regarded as a departure from the intended spirit and scope of example embodiments, and all such modifications as would be obvious to one skilled in the art are intended to be included within the scope of the following claims.

Reference will now be made to example embodiments, which are illustrated in the accompanying drawings, wherein like reference numerals may refer to like components throughout.

Hereinafter, a memory device and a method of storing a data bit according to example embodiments are described in detail with reference to the attached drawings. When detailed descriptions related to a well-known related function or configuration may detract from an explanation of example embodiments, such detailed descriptions will be omitted herein for clarity. Also, terms used throughout the present specification are used to appropriately describe example embodiments, and thus may be different depending upon a user and an operator's intention, or practices of application fields of example embodiments. Therefore, the terms may be defined based on descriptions made throughout example embodiments.

FIG. 1 is a block diagram illustrating a memory device 100 according to example embodiments.

Referring to FIG. 1, the memory device 100 includes a multi-level cell (MLC) array 110, an error correction unit 120, an error pattern analysis unit 130, and a data conversion unit 140. The memory device 100 may also include a host interface 150 to interact with a host 200.

The MLC array 110 may include a plurality of MLCs. A process of storing data in an MLC of a non-volatile memory including a flash memory, an Electrically Erasable Programmable Read Only Memory (EEPROM), and the like may be referred to as a programming process, and may correspond to a process of changing a threshold voltage of the MLC.

A process of programming the data in the MLC of the non-volatile memory may be performed by a mechanism including Fowler-Nordheim tunneling (F-N tunneling), a hot carrier effect, and the like. F-N tunneling may change the threshold voltage of the MLC. A single-bit cell may have a low threshold voltage level or a high threshold voltage level, and may express data of "0" or "1" using the two threshold voltage levels.

In a Charge Trap Flash (CTF) memory device, the MLC array 110 may include an insulation layer including a charge trap site that may trap a charge.

A charge potential difference between adjacent cells may exist in the MLC. A lateral electric field may occur due to the potential difference, and the charge stored in a charge trap layer of the MLC may move in a word line direction.

When the charge stored in the charge trap layer moves in the word line direction, a threshold voltage of a programmed cell may gradually decrease, and the stored data may be lost, thereby deteriorating reliability of a memory.

In the charge trap layer such as silicon nitride ($Si_3N_4$), the charge mobility may change non-linearly based on a strength of an electric field that may be applied to the charge trap layer. As the strength of the electric field increases, charge mobility may non-linearly increase.

In a four-level MLC, a cell may have three levels of state "00," state "01," or state "10" as a programming state, and may have state "11" as a deletion state. Since the programming state may be classified into three states, a maximum of threshold voltages of the programming state may have, for example, is about 4.5 V, and may include a state from −2 V to −4 V as the deletion state. When the data is saved for a relatively long period of time, a majority of electrons stored in the cell may move to the adjacent cell. Accordingly, the data may not maintain an initial input state.

The memory device 100 according to example embodiments may control an error pattern having a high occurrence probability due to a lateral electric field between the adjacent cells of the MLC to program a data bit in the MLC.

For this, the error correction unit 120 may encode data to be recorded in the MLC such that the encoded data is converted in to a codeword.

The error pattern analysis unit 130 may analyze a first data pattern corresponding to an error pattern included in the converted codeword.

The data conversion unit 140 may convert the analyzed first data pattern into a second data pattern.

When a number of the analyzed first data patterns is greater than a probable average value indicating that the error pattern in the codeword occurs, the error pattern analysis unit 130 may control the data conversion unit 140 to convert the first data pattern into the second data pattern.

The error correction unit 120 may record, in the MLC, the codeword including the second data pattern generated by the data conversion unit 140.

Depending on example embodiments, the first data pattern may correspond to an error pattern occurring due to a data storage pattern between the adjacent cells of the MLC.

Depending on example embodiments, the first data pattern may correspond to the error pattern occurring due to a lateral electric field between the adjacent cells of the MLC. The error pattern may occur due to a threshold voltage change caused by a charge movement in the MLC due to the lateral electric field.

The second data pattern may exclude the error pattern, and may correspond to a data pattern having a low frequency of errors.

Depending on example embodiments, the data conversion unit 140 may perform interleaving of the first data pattern to convert the first data pattern into the second data pattern. An interleaving scheme according to example embodiments may correspond to a scheme of transposing a specific data bit between data logical pages. When the MLC corresponds to a four-level cell, the data conversion unit 140 may transpose a Most Significant Bit (MSB) and a Least Significant Bit (LSB) of a data logical page corresponding to the first data pattern to generate the second data pattern.

Depending on example embodiments, the data conversion unit 140 may perform a bit operation in the data logical page corresponding to the first data pattern to generate the second data pattern including the bit-operated data logical page.

Depending on example embodiments, the data conversion unit 140 may perform a data-shift operation in the data logical page corresponding to the first data pattern to generate the second data pattern including the shift-operated data logical page.

The memory device 100 according to example embodiments may convert the first data pattern corresponding to the above-described error pattern into the second data pattern to program the second data pattern in the MLC, and inversely may convert the codeword including the second data pattern programmed in the MLC to read the data.

For this, the error pattern analysis unit 130 may read and extract the codeword including the second data pattern recorded in the MLC to analyze the codeword.

The data conversion unit 140 may convert the second data pattern into the first data pattern corresponding to the error pattern.

Depending on example embodiments, the data conversion unit 140 may perform de-interleaving of the second data pattern to convert the de-interleaved second data pattern into the first data pattern.

Depending on example embodiments, the data conversion unit 140 may perform an inverse bit operation in the data logical page corresponding to the second data pattern to generate the first data pattern including the inverse bit-operated data logical page.

Depending on example embodiments, the data conversion unit 140 may inversely perform a data-shift operation in the data logical page corresponding to the second data pattern to generate the first data pattern including the inverse shift-operated data logical page.

The error correction unit 120 may decode the codeword including the first data pattern.

Depending on example embodiments, when the codeword is outside an error correcting capability range, the error correction unit 120 may increase or decrease a read voltage applied to the MLC and analyze a bit error based on the increase or decrease of the read voltage to select and decode the codeword corresponding to the analyzed bit error based on the error pattern.

Depending on example embodiments, when an increase or decrease of a number of bit errors with respect to the bit error does not occur, the error correction unit 120 may select the codeword in which a number of error patterns is highest.

The host interface 150 may transmit the decoded codeword to the host 200. The host 200 may include, for example, a controller of a mobile device, a controller of a computer apparatus, and the like. The host interface 150 may perform a control and buffering function for an interface between the host 200 and the MLC.

The memory device 100 according to example embodiments may correspond to a CTF memory device.

Hereinafter, referring to FIG. 2, a method of storing a data bit according to example embodiments is described in detail.

Figure 2:
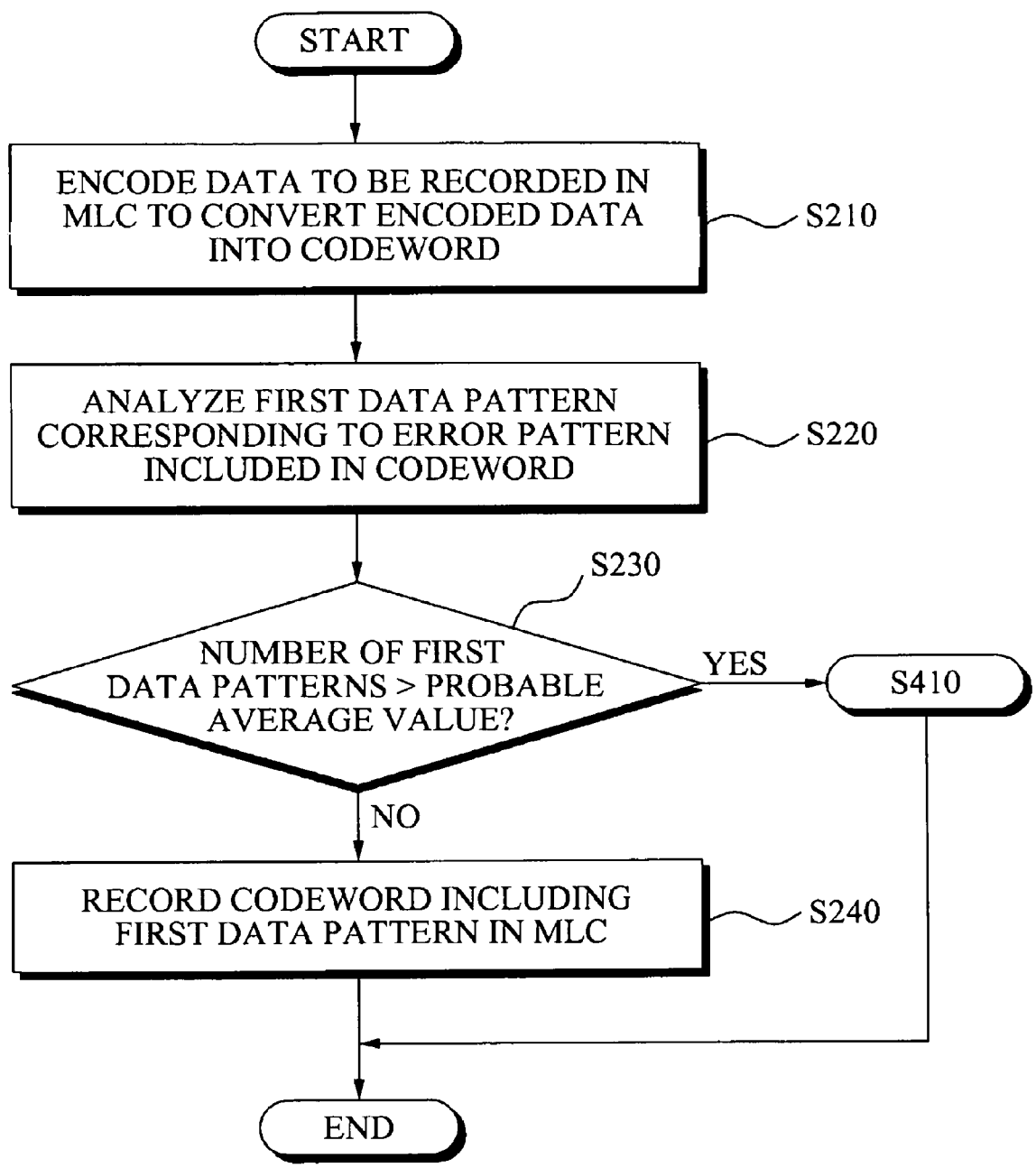
FIG. 2 is a flowchart illustrating a method of storing a data bit in a memory device according to example embodiments.

FIG. 2 is a flowchart illustrating a method of storing a data bit in a memory device according to example embodiments.

Referring to FIG. 2, in operation S210, the method of storing the data bit according to example embodiments may encode data to be recorded in an MLC to convert the encoded data into a codeword.

In operation S220, the method may analyze a first data pattern corresponding to an error pattern included in the codeword. Hereinafter, referring to FIG. 3, the first data pattern corresponding to the error pattern included in the codeword is described in detail.

Figure 3:
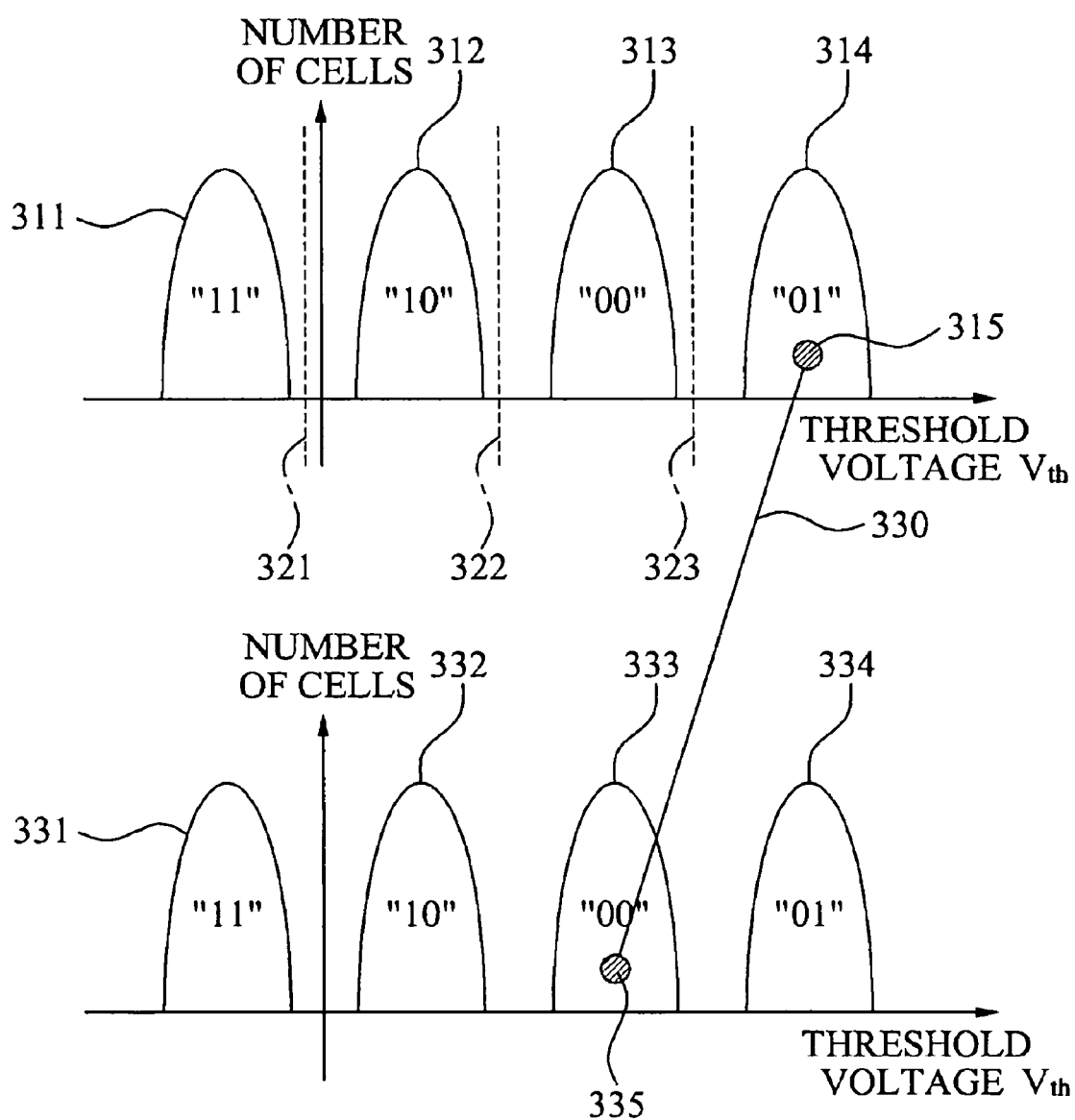
FIG. 3 illustrates an analysis process of a first data pattern corresponding to an error pattern included in a codeword from a multi-level cell according to example embodiments.

FIG. 3 illustrates an analysis process of a first data pattern corresponding to an error pattern included in a codeword from an MLC according to example embodiments.

Referring to FIG. 3, a relation between a threshold voltage and 2-bit data stored by MLCs is illustrated.

A distribution of threshold voltages of the MLCs is shown as a number of the MLCs corresponding to the threshold voltage.

Since minute electrical differences between each of the MLCs exist, the threshold voltages of the MLCs may generate the distribution with a predetermined range.

A distribution 311 may denote the MLCs storing data "11".
A distribution 312 may denote the MLCs storing data "10".
A distribution 313 may denote the MLCs storing data "00".
A distribution 314 may denote the MLCs storing data "01".

Generally, when the MLC may have any one of $2^m$ threshold voltage levels, the MLC may store a maximum of "m" bits of data, where "m" may be an integer. The m-bit data stored in the MLC may be ordered from an MSB to an LSB.

The memory device 100 may decide the MSB stored in MLCs of a memory page using a second read voltage level 322. The memory device 100 may decide, as "0", the MSB stored in the MLCs having the threshold voltage higher than the second read voltage level 322, and may decide, as "1", the MSB stored in the MLCs having the threshold voltage lower than the second read voltage level 322.

The memory device 100 may decide the LSB stored in the MLCs of the memory page using a first read voltage level 321 and a third read voltage level 323. The memory device 100 may decide, as "1", the LSB stored in the MLCs having the threshold voltage lower than the first read voltage level 321. The memory device 100 may also decide, as "1", the LSB stored in the MLCs having the threshold voltage higher than the third read voltage level 323. The memory device 100 may decide, as "0", the LSB stored in the MLCs having the threshold voltage higher than the first read voltage level 321 and lower than the third read voltage level 323.

A state 315 may denote that the threshold voltage of the identified MLC is included in the distribution 314 when programming data. The data programmed in the identified MLC may correspond to "01".

In a CTF memory device according to example embodiments, a charge stored in the MLC may laterally move due to a lateral electric field between adjacent cells and the threshold voltage may decrease or increase as a result. When having a data storage pattern of storing data of a highest level in a cell, for example, a state where the threshold voltage has a highest value, and storing data of a lowest level in an adjacent cell thereof, for example, a state where the threshold voltage has a lowest value, a lateral potential difference between the adjacent cells may become heightened, and a lateral charge movement may be more likely to occur.

In FIG. 3, when the data storage pattern between the adjacent cells of the MLC includes state "11," where the threshold voltage corresponds to a lowest level, and state "01" where the threshold voltage corresponds to a highest level, for example, when the first data pattern corresponds to "110111" or "011101," the lateral charge movement may occur more easily.

An arrow 340 denotes a change of the threshold voltage of the identified MLC caused by the lateral charge movement occurring due to the lateral electric field. When the first data pattern corresponds to "110111" or "011101", a state 335 may denote that the threshold voltage of the identified MLC is included in a distribution 333 due to the lateral charge movement when the data is read and extracted. The data read from the identified MLC may correspond to "00".

An example embodiment of FIG. 3 denotes a case where the MLC stores 2-bit data. However, example embodiments may be applied to a case where the MLC stores m-bit data, e.g. where m is greater than two (m>2).

Returning to FIG. 2, in operation S220, the method may analyze the first data pattern corresponding to the error pattern, which is included in the codeword, due to the lateral charge movement caused by the lateral electric field between the adjacent cells as illustrated in FIG. 3. As described above, depending on example embodiments, the first data pattern may correspond to the error pattern occurring due to the data storage pattern between the adjacent cells of the MLC.

Depending on example embodiments, the first data pattern may correspond to the error pattern occurring due to the lateral electric field between the adjacent cells of the MLC. The error pattern may occur due to a threshold voltage change caused by a charge movement in the MLC due to the lateral electric field.

Referring to FIG. 2 again, in operation S230, the method of storing the data bit according to example embodiments may include a process of determining whether a number of the first data patterns analyzed in operation S220 is greater than a probable average value that the error pattern in the codeword occurs. If the number is greater than the probable average value, the method may flow to operation S410, else the method may flow to operation S240.

In operation S240, when the number of the analyzed first data patterns is less than the probable average value that the error pattern in the codeword occurs, the method may not convert the first data pattern into the second data pattern, and may encode the codeword including the first data pattern to program (record) the encoded codeword in the MLC.

Conversely, when the number of the analyzed first data patterns is greater than the probable average value that the error pattern in the codeword occurs, the method may proceed to operation S410 to convert the analyzed first data pattern into the second data pattern.

Hereinafter, referring to FIG. 4, a process of converting a first data pattern into a second data pattern is described in detail.

Figure 4:
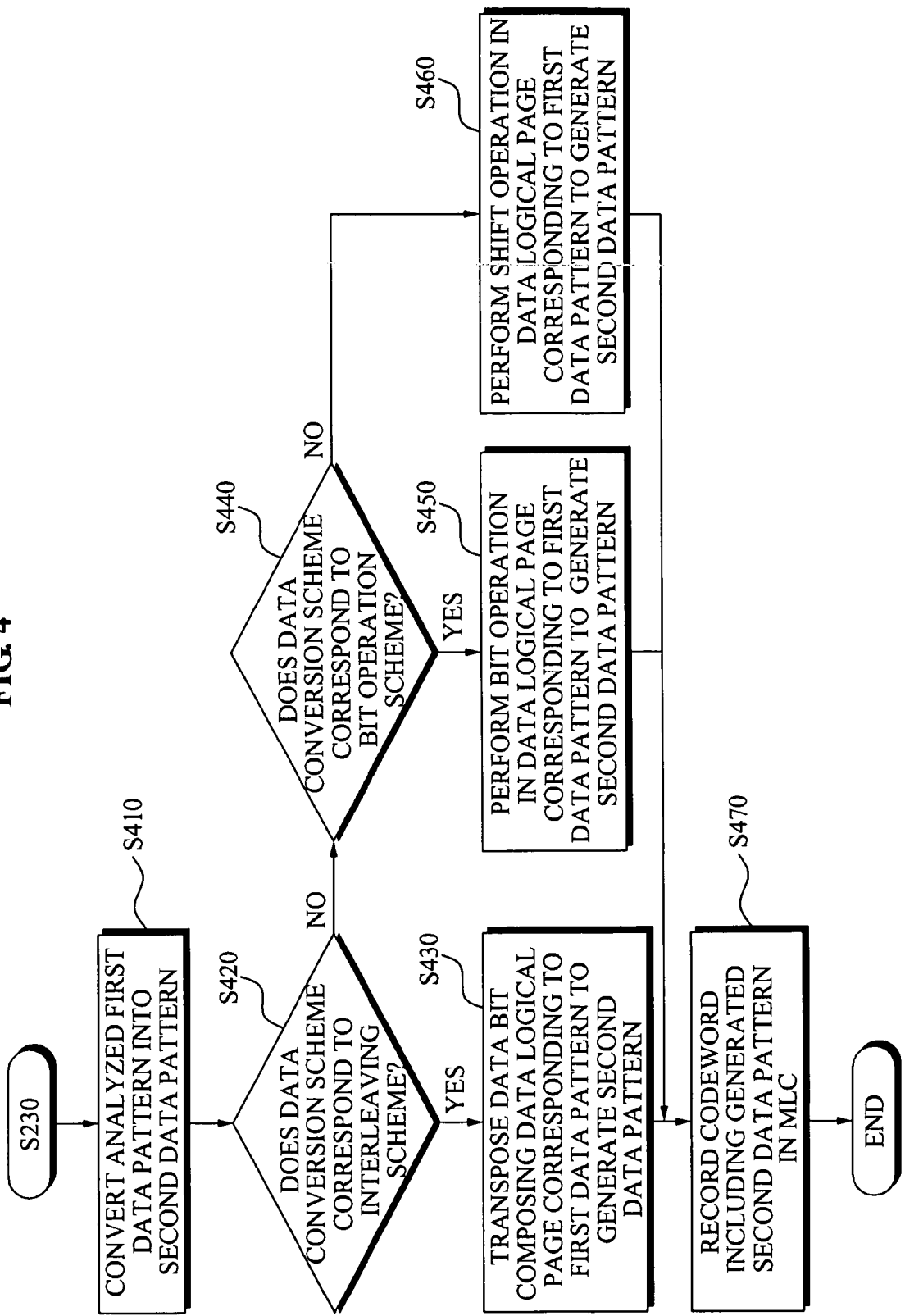
FIG. 4 is a flowchart illustrating a process of converting a first data pattern corresponding to an error pattern into a second data pattern, the process being performed in a memory device according to example embodiments.

FIG. 4 is a flowchart illustrating a process of converting a first data pattern corresponding to an error pattern into a second data pattern, the process being performed in a memory device according to example embodiments.

Referring to FIG. 4, in operation S410, when a number of the analyzed first data patterns is greater than a probable average value that the error pattern in the codeword occurs in operation S230, a data pattern conversion process may convert the analyzed first data pattern into the second data pattern.

Depending on example embodiments, a data conversion scheme into the second data pattern according to example embodiments may include an interleaving scheme, a bit operation scheme, or a shift operation scheme.

When the data conversion scheme corresponds to the interleaving scheme in operation S420, the process may perform interleaving of the first data pattern to convert the first data pattern into the second data pattern at operation S430, else the process may flow to operation S440. In operation S430, the process may transpose a data bit composing a data logical page corresponding to the first data pattern to convert the first data pattern into the second data pattern including the transposed data bit.

For example, when the MLC corresponds to a four-level cell, the process may transpose an MSB and an LSB of the data logical page corresponding to the first data pattern using the interleaving scheme to generate the second data pattern.

In operation S450, when the data conversion scheme corresponds to the bit operation scheme in operation S440, the process may perform a bit operation in the data logical page corresponding to the first data pattern to generate the second data pattern including the bit-operated data logical page, else the process may flow to operation S460.

For example, the bit operation may be performed by a specific operation such as summing the data logical page and the selected data bit.

In operation S460, when the data conversion scheme may correspond to the shift operation scheme in operation S440, the process may perform a data-shift operation in the data logical page corresponding to the first data pattern to generate the second data pattern including the shift-operated data logical page.

The data-shift operation may correspond to an operation of converting '1' into '0' and including a conversion with respect to an inversion thereof.

In operation S470, the process may program (records) the codeword including the converted second data pattern in the MLC.

Hereinafter, referring to FIG. 5, a process of reading a data bit stored in an MLC is described in detail.

Figure 5:
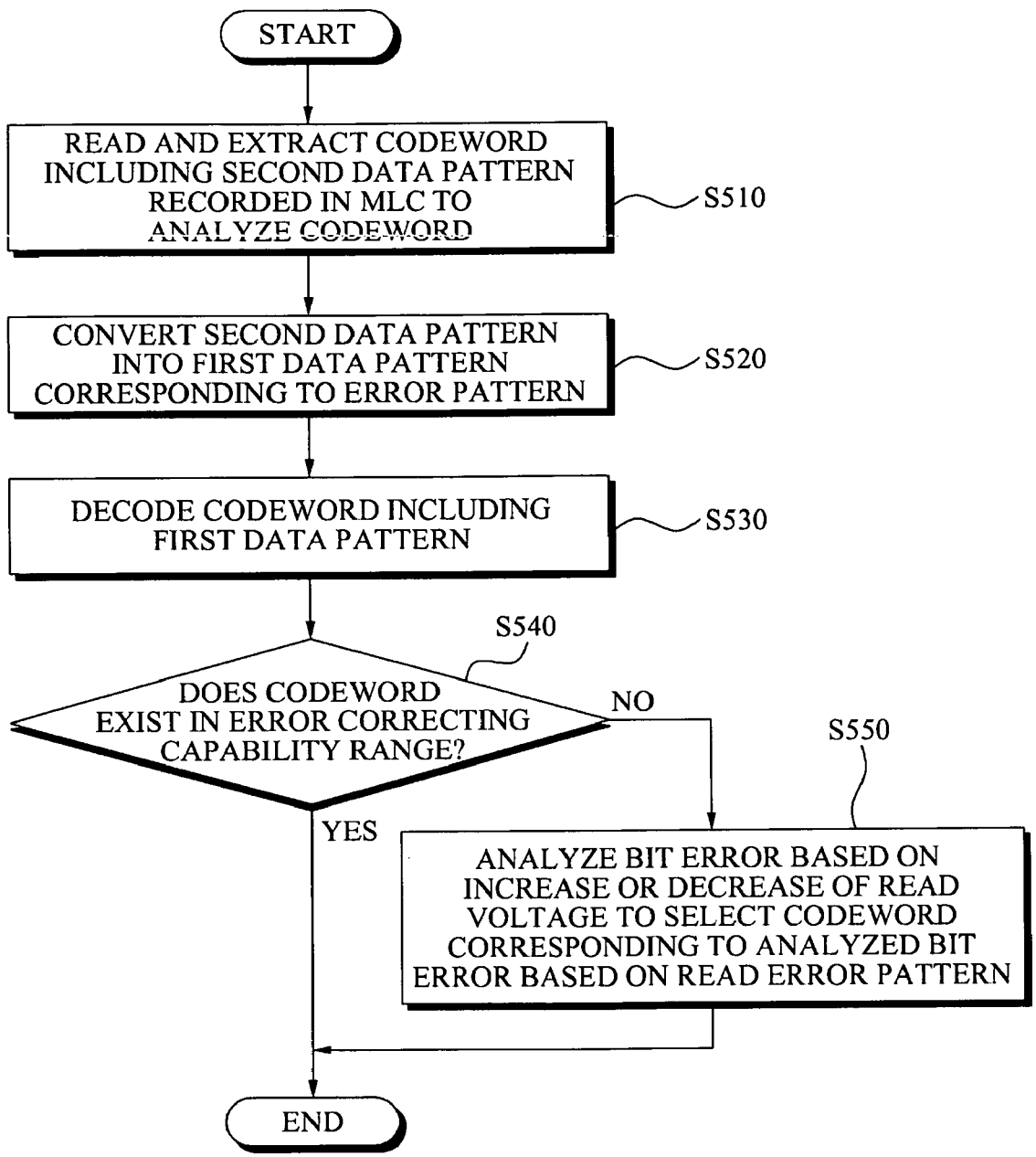
FIG. 5 is a flowchart illustrating a process of reading a data bit stored in a memory device, the process being performed in the memory device according to example embodiments.

FIG. 5 is a flowchart illustrating a process of reading a data bit stored in a memory device, the process being performed in the memory device according to example embodiments.

Referring to FIG. 5, in operation S510, a method of reading the data bit may read and extract the codeword including the second data pattern recorded in the MLC to analyze the codeword.

In operation S520, the method may convert the second data pattern into the first data pattern corresponding to the error pattern.

In operation S530, the method may decode the codeword including the first data pattern.

In operation S540, the method may determine whether the codeword exists in an error correcting capability range. In operation S550, when the codeword is outside the error correcting capability range, the method may increase or decrease a read voltage applied to the MLC and analyze a bit error based on the increase or decrease of the read voltage to select and decode the codeword corresponding to the analyzed bit error based on the error pattern.

Depending on example embodiments, a method of selecting and decoding the codeword may analyze frequency information about the read error pattern, and may select the codeword including the read error pattern in which the analyzed frequency information is highest.

Depending on example embodiments, the method of selecting and decoding the codeword may analyze a Hamming distance to the read word and the codeword, and may select the codeword in which the analyzed Hamming distance is lowest.

Depending on example embodiments, the method of selecting and decoding the codeword may store error pattern information about a weight of the read error pattern including data before encoding, and may select the codeword based on at least one of the error pattern information and the analyzed Hamming distance.

When the codeword is less than or equal to the error correcting capability, all errors of the codeword may be corrected. Examples of codes where error correcting capability is explicitly shown are block codes and the like. Examples of block codes include Bose, Ray-Chaudhuri, Hocquenghem (BCH) codes, Reed-Solomon (RS) codes, and the like. Examples of decoding schemes for the block codes include a Meggitt decoding scheme, a Berlekamp-Massey decoding scheme, a Euclid decoding scheme, and the like.

The method of storing the data bit according to example embodiments may be recorded in computer-readable media including program instructions to implement various operations embodied by a computer. The media may also include, alone or in combination with the program instructions, data files, data structures, and the like. The media and program instructions may be those specially designed and constructed for the purposes of example embodiments, or they may be of the kind well-known and available to those having skill in the computer software arts. Examples of computer-readable media include magnetic media such as hard disks, floppy disks, and magnetic tape; optical media such as CD ROM disks and DVD; magneto-optical media such as optical disks; and hardware devices that are specially configured to store and perform program instructions, such as read-only memory (ROM), random access memory (RAM), flash memory, and the like. Examples of program instructions include both machine code, such as produced by a compiler, and files containing higher level code that may be executed by the computer using an interpreter. The described hardware devices may be configured to act as one or more software modules in order to perform the operations of example embodiments.

Memory devices and/or memory controllers according to example embodiments may be embodied using various types of packages. For example, the flash memory devices and/or memory controllers may be embodied using packages such as Package on Packages (PoPs), Ball Grid Arrays (BGAs), Chip Scale Packages (CSPs), Plastic Leaded Chip Carrier (PLCC), Plastic Dual In-Line Package (PDIP), Die in Waffle Pack, Die in Wafer Form, Chip On Board (COB), Ceramic Dual In-Line Package (CERDIP), Plastic Metric Quad Flat Pack (MQFP), Quad Flatpack (QFP), Small Outline Integrated Circuit (SOIC), Shrink Small Outline Package (SSOP), Thin Small Outline (TSOP), Thin Quad Flatpack (TQFP), System In Package (SIP), Multi Chip Package (MCP), Wafer-level Fabricated Package (WFP), Wafer-Level Processed Stack Package (WSP), and the like.

The flash memory devices and/or the memory controllers may constitute memory cards. In this case, the memory controllers may be constructed to communicate with an external device for example, a host using any one of various types of interface protocols such as a Universal Serial Bus (USB), a Multi Media Card (MMC), a Peripheral Component Interconnect-Express (PCI-E), Serial Advanced Technology Attachment (SATA), Parallel ATA (PATA), Small Computer System Interface (SCSI), Enhanced Small Device Interface (ESDI), and Integrated Drive Electronics (IDE).

The flash memory devices may be non-volatile memory devices that can maintain stored data even when power is cut off. According to an increase in the use of mobile devices such as a cellular phone, a personal digital assistant (PDA), a digital camera, a portable game console, and an MP3 player, the flash memory devices may be more widely used as data storage and code storage. The flash memory devices may be used in home applications such as a high definition television (HDTV), a digital video disk (DVD), a router, and a Global Positioning System (GPS).

A computing system according to example embodiments may include a microprocessor that is electrically connected with a bus, a user interface, a modem such as a baseband chipset, a memory controller, and a flash memory device. The flash memory device may store N-bit data via the memory controller. The N-bit data is processed or will be processed by the microprocessor and N may be 1 or an integer greater than 1. When the computing system is a mobile apparatus, a battery may be additionally provided to supply operation voltage of the computing system.

It will be apparent to those of ordinary skill in the art that the computing system according to example embodiments may further include an application chipset, a camera image processor (CIS), a mobile Dynamic Random Access Memory (DRAM), and the like. For example, the memory controller and the flash memory device may constitute a solid state drive/disk (SSD) that uses a non-volatile memory to store data.

While example embodiments have been particularly shown and described, it will be understood by those of ordinary skill in the art that various changes in form and details may be made therein without departing from the spirit and scope of example embodiments as defined by the following claims.

What is claimed is:

1. A memory device comprising:
   a multi-level cell (MLC) array including a plurality of MLCs;
   an error correction unit configured to encode data, where the encoded data is converted into a codeword;
   an error pattern analysis unit configured to analyze a first data pattern included in the codeword corresponding to an error pattern; and
   a data conversion unit configured to convert the analyzed first data pattern into a second data pattern.

2. The memory device of claim 1, wherein the error pattern analysis unit controls the data conversion unit to convert the first data pattern into the second data pattern when a number of the analyzed first data patterns is greater than a probable average value, the probable average indicating when the error pattern occurs in the codeword.

3. The memory device of claim 1, wherein the error correction unit records the codeword including the second data pattern in the MLC.

4. The memory device of claim 1, wherein the first data pattern corresponds to the error pattern occurring due to a data storage pattern between adjacent cells of the MLC.

5. The memory device of claim 1, wherein the first data pattern corresponds to the error pattern occurring due to a lateral electric field between adjacent cells of the MLC.

6. The memory device of claim 5, wherein the error pattern occurs due to a threshold voltage change caused by a charge movement in the MLC due to the lateral electric field.

7. The memory device of claim 1, wherein the second data pattern excludes the error pattern and corresponds to a data pattern having a low frequency of errors.

8. The memory device of claim 1, wherein the data conversion unit performs interleaving of the first data pattern to convert the first data pattern into the second data pattern.

9. The memory device of claim 8, wherein the MLC corresponds to a four-level cell and the data conversion unit transposes a Most Significant Bit (MSB) and a Least Significant Bit (LSB) of a data logical page corresponding to the first data pattern to generate the second data pattern.

10. The memory device of claim 1, wherein the data conversion unit performs a bit operation in a data logical page corresponding to the first data pattern to generate the second data pattern including the bit-operated data logical page.

11. The memory device of claim 1, wherein the data conversion unit performs a data-shift operation in a data logical page corresponding to the first data pattern to generate the second data pattern including the shift-operated data logical page.

12. The memory device of claim 1, wherein the memory device corresponds to a Charge Trap Flash (CTF) memory device.

13. The memory device of claim 1, wherein,
the error pattern analysis unit reads and extracts the codeword including the second data pattern recorded in the MLC to analyze the codeword,
the data conversion unit converts the second data pattern into the first data pattern corresponding to the error pattern, and
the error correction unit decodes the codeword including the first data pattern.

14. The memory device of claim 13, wherein the data conversion unit performs de-interleaving of the second data pattern to convert the de-interleaved second data pattern into the first data pattern.

15. The memory device of claim 13, wherein the data conversion unit performs an inverse bit operation in a data logical page corresponding to the second data pattern to generate the first data pattern including the inverse bit-operated data logical page.

16. The memory device of claim 13, wherein the data conversion unit inversely performs a data-shift operation in a data logical page corresponding to the second data pattern to generate the first data pattern including the inverse shift-operated data logical page.

17. The memory device of claim 13, wherein the error correction unit increases or decreases a read voltage applied to the MLC and analyzes a bit error based on the increase or decrease of the read voltage to select the codeword corresponding to the analyzed bit error based on the error pattern when the codeword is outside an error correcting capability range.

18. The memory device of claim 17, wherein the error correction unit selects the codeword in which a number of the error patterns is highest when an increase or decrease of a number of bit errors with respect to the bit error does not exist.

19. A method of storing data, comprising:
encoding data to convert the encoded data into a codeword, by an error correction unit;
analyzing a first data pattern corresponding to an error pattern included in the codeword, by an error pattern analyzing unit; and
converting the analyzed first data pattern into a second data pattern, by a data conversion unit.

20. The method of claim 19, further comprising:
comparing a number of the analyzed first data patterns to a probable average value, the probable average indicating when the error pattern occurs in the codeword.

21. The method of claim 20, wherein the converting converts when the number of the analyzed first data patterns is greater than the probable average value that the error pattern in the codeword occurs.

22. The method of claim 21, wherein the converting includes transposing a Most Significant Bit (MSB) and a Least Significant Bit (LSB) of a data logical page corresponding to the first data pattern to generate the second data pattern.

23. The method of claim 21, wherein the converting includes performing a bit operation in a data logical page corresponding to the first data pattern to generate the second data pattern including the bit-operated data logical page.

24. The method of claim 21, wherein the converting includes performing a data-shift operation in a data logical page corresponding to the first data pattern to generate the second data pattern including the shift-operated data logical page.

25. The method of claim 20, further comprising:
recording the codeword including the converted second data pattern in a multi-level cell (MLC) when the number of the analyzed first data patterns is less than or equal to the probable average value that the error pattern in the codeword occurs.

26. The method of claim 19, further comprising:
recording the codeword including the converted second data pattern in a multi-level cell (MLC).

27. The method of claim 26, further comprising:
reading and extracting the codeword including the second data pattern recorded in the MLC to analyze the codeword;
converting the second data pattern into the first data pattern corresponding to the error pattern; and
decoding the codeword including the first data pattern.

28. The method of claim 27, further comprising:
analyzing a bit error based on an increase or decrease of a read voltage to select the codeword corresponding to the analyzed bit error based on the error pattern when the codeword is outside an error correcting capability range.

29. A computer-readable medium encoded with a computer program for implementing the method of claim 19.

* * * * *